United States Patent
Huang et al.

(10) Patent No.: US 9,385,193 B2
(45) Date of Patent: Jul. 5, 2016

(54) FINFET TRANSISTOR STRUCTURE AND METHOD FOR MAKING THE SAME

(71) Applicant: UNITED MICROELECTRONICS CORP., Hsin-Chu (TW)

(72) Inventors: Rai-Min Huang, Taipei (TW);
Sheng-Huei Dai, Taitung County (TW);
Chen-Hua Tsai, Hsinchu County (TW);
Duan Quan Liao, Singapore (SG);
Yikun Chen, Singapore (SG); Xiao Zhong Zhu, Singapore (SG)

(73) Assignee: UNITED MICROELECTRONICS CORP., Science-Based Industrial Park, Hsin-Chu (TW)

(*) Notice: Subject to any disclaimer, the term of this patent is extended or adjusted under 35 U.S.C. 154(b) by 0 days.

(21) Appl. No.: 14/288,369

(22) Filed: May 27, 2014

(65) Prior Publication Data
US 2014/0252482 A1 Sep. 11, 2014

Related U.S. Application Data

(63) Continuation of application No. 13/116,018, filed on May 26, 2011, now Pat. No. 8,772,860.

(51) Int. Cl.
*H01L 29/06* (2006.01)
*H01L 27/108* (2006.01)
*H01L 29/66* (2006.01)
*H01L 29/78* (2006.01)

(52) U.S. Cl.
CPC ...... *H01L 29/0653* (2013.01); *H01L 27/10826* (2013.01); *H01L 27/10879* (2013.01); *H01L 29/66795* (2013.01); *H01L 29/785* (2013.01); *H01L 29/7854* (2013.01)

(58) Field of Classification Search
CPC ............. H01L 27/10879; H01L 27/10826; H01L 29/0653
See application file for complete search history.

(56) References Cited

U.S. PATENT DOCUMENTS

| | | | |
|---|---|---|---|
| 6,043,138 A | 3/2000 | Ibok | |
| 6,180,476 B1 | 1/2001 | Yu | |
| 6,492,216 B1 | 12/2002 | Yeo | |
| 6,921,963 B2 | 7/2005 | Krivokapic | |
| 7,087,477 B2 | 8/2006 | Fried | |
| 7,091,551 B1 | 8/2006 | Anderson | |
| 7,176,067 B2 | 2/2007 | Jung | |
| 7,247,887 B2 | 7/2007 | King | |
| 7,250,658 B2 | 7/2007 | Doris | |
| 7,309,626 B2 | 12/2007 | Ieong | |
| 7,352,034 B2 | 4/2008 | Booth, Jr. | |
| 7,470,570 B2 | 12/2008 | Beintner | |

(Continued)

FOREIGN PATENT DOCUMENTS

| CN | 101064312 A | 10/2007 |
|---|---|---|
| CN | 101752258 A | 6/2010 |

(Continued)

*Primary Examiner* — Amar Movva
(74) *Attorney, Agent, or Firm* — Winston Hsu; Scott Margo (57) ABSTRACT

A FINFET transistor structure includes a substrate including a fin structure. Two combined recesses embedded within the substrate, wherein each of the combined recesses includes a first recess extending in a vertical direction and a second recess extending in a lateral direction, the second recess has a protruding side extending to and under the fin structure. Two filling layers respectively fill in the combined recesses. A gate structure crosses the fin structure.

8 Claims, 7 Drawing Sheets

(56) References Cited

U.S. PATENT DOCUMENTS

| | | |
|---|---|---|
| 7,531,437 B2 | 5/2009 | Brask |
| 7,538,386 B2 | 5/2009 | Jang |
| 7,569,857 B2 | 8/2009 | Simon |
| 2004/0195624 A1 | 10/2004 | Liu |
| 2005/0051825 A1 | 3/2005 | Fujiwara |
| 2006/0099830 A1 | 5/2006 | Walther |
| 2006/0214231 A1 | 9/2006 | Shah |
| 2006/0286729 A1 | 12/2006 | Kavalieros |
| 2007/0057325 A1 | 3/2007 | Hsu |
| 2007/0108528 A1 | 5/2007 | Anderson |
| 2007/0158756 A1 | 7/2007 | Dreeskornfeld |
| 2008/0079076 A1 | 4/2008 | Sheen |
| 2008/0157208 A1 | 7/2008 | Fischer |
| 2009/0124097 A1 | 5/2009 | Cheng |
| 2009/0242964 A1 | 10/2009 | Akil |
| 2009/0269916 A1 | 10/2009 | Kang |
| 2009/0321836 A1 | 12/2009 | Wei |
| 2010/0048027 A1 | 2/2010 | Cheng |
| 2010/0072553 A1 | 3/2010 | Xu |
| 2010/0144121 A1* | 6/2010 | Chang ............. H01L 29/7851 438/478 |
| 2010/0167506 A1 | 7/2010 | Lin |

FOREIGN PATENT DOCUMENTS

| | | |
|---|---|---|
| CN | 101814507 A | 8/2010 |
| TW | 200947608 | 11/2009 |
| TW | 201027724 | 7/2010 |

* cited by examiner

FINFET TRANSISTOR STRUCTURE AND METHOD FOR MAKING THE SAME

CROSS REFERENCE TO RELATED APPLICATIONS

This patent application is a continuation application of and claims priority to U.S. patent application Ser. No. 13/116, 018, filed on May 26, 2011, and entitled "FINFET TRANSISTOR STRUCTURE AND METHOD FOR MAKING THE SAME" the entire contents of which are incorporated herein by reference.

BACKGROUND OF THE INVENTION

1. Field of the Invention

The present invention generally relates to a FINFET transistor structure and a method for forming various FINFET transistor structures. In particular, the present invention is directed to a method for forming various FINFET transistor structures by different possibilities of formation of oxide layers to reduce the leak current of the FINFET transistor structure or to maintain the heat-dissipating of the FINFET transistor structure.

2. Description of the Prior Art

One of the purposes of the development of the semiconductor industry is to enhance the efficiency of the semiconductor devices and to reduce the energy consumption of the semiconductor devices. When it comes to enhancing the efficiency of the semiconductor devices, it is already known in the prior art that different lattice structures may facilitate the mobility of the electrons or the holes.

For example, a higher carrier mobility can be observed when a metal-oxide-semiconductor (MOS) is constructed on an n-channel of a (100) lattice of Si, and similarly a higher carrier mobility can be observed when a metal-oxide-semiconductor (MOS) is constructed on a P-channel of a (110) lattice of Si. As a result, when a planar complementary MOS is constructed, Si of different lattices is formed together to get a substrate so that MOS of n-channel is constructed on a (100) lattice, and MOS of P-channel is constructed on a (110) lattice to get a better performance.

However, as the critical dimension of the devices shrinks, in particular for the generations after 65 nm, the multi-gate devices such as a fin field effect transistor (FinFET) is proposed to replace the planar complementary MOS since it is getting harder and harder to reduce the physical dimension of the conventional planar complementary MOS. However, in one aspect, because some of the bottom of the fin field effect transistor is directly connected to the substrate, inevitable leak current is always a serious problem. In another aspect, should the fin field effect transistor be constructed on an SOI substrate to solve the problem of inevitable leak current, another problem arises because of a higher production cost due to much more expensive SOI substrates.

Given the above, a novel method for forming a FINFET transistor structure as well as a novel FINFET transistor structure are still needed to bring a resolution to the dilemma.

SUMMARY OF THE INVENTION

The present invention accordingly proposes a method for forming various FINFET transistor structures to obtain various FINFET transistor structures to meet various demands. The present invention utilizes the different possibilities for forming oxide to construct FINFET transistors of different structures. In one aspect, there is no need to use the expensive SOI substrate and a FINFET transistor structure disposed on an insulating layer can still be formed. Moreover it is characterized that at least one of the top side and the bottom side of the insulating layer is uneven. In another aspect, the present invention also proposes a FINFET transistor structure with a bottle neck directly connected to the substrate. The bottle neck is capable of lowering the leak current of the FINFET transistor structure without reducing the heat-dissipating ability of the FINFET transistor structure.

The present invention proposes a FINFET transistor structure. The FINFET transistor structure of the present invention includes a substrate comprising a fin structure and two combined recesses embedded within the substrate, wherein each of the combined recesses comprises a first recess extending in a vertical direction and a second recess extending in a lateral direction, the second recess has a protruding side extending to and under the fin structure. Two filling layers fill in the combined recesses. A gate structure crosses the fin structure.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIGS. 1-8B illustrate the method for forming various FINFET transistor structures to obtain various FINFET transistor structures of the present invention.

DETAILED DESCRIPTION

The present invention provides a novel method for forming various FINFET transistor structures to obtain various FINFET transistor structures to meet various demands. In the method of the present invention, the procedures for forming the oxide may be different, so FINFET transistors of different structures may be constructed. In one aspect, there is no need to use expensive SOI substrate, and a FINFET transistor structure disposed on an insulating layer can still be formed. Moreover it is characterized that at least one of the top side and the bottom side of the insulating layer is uneven. In another aspect, the present invention also proposes a FINFET transistor structure with a bottle neck directly connected to the substrate. The bottle neck lowers the leak current of the FINFET transistor structure without reducing the heat-dissipating ability of the FINFET transistor structure.

FIGS. 1-8B illustrate the method for forming various FINFET transistor structures to obtain various FINFET transistor structures of the present invention. First please refer to FIG. 3, a substrate 101 and at least a fin structure 110 disposed on the substrate 110 are provided. The fin structure 110 includes a mask layer 111, a buffer layer 112, a cap layer 113, a fin conductive layer 117 and a spacer 114.

Figure 1:
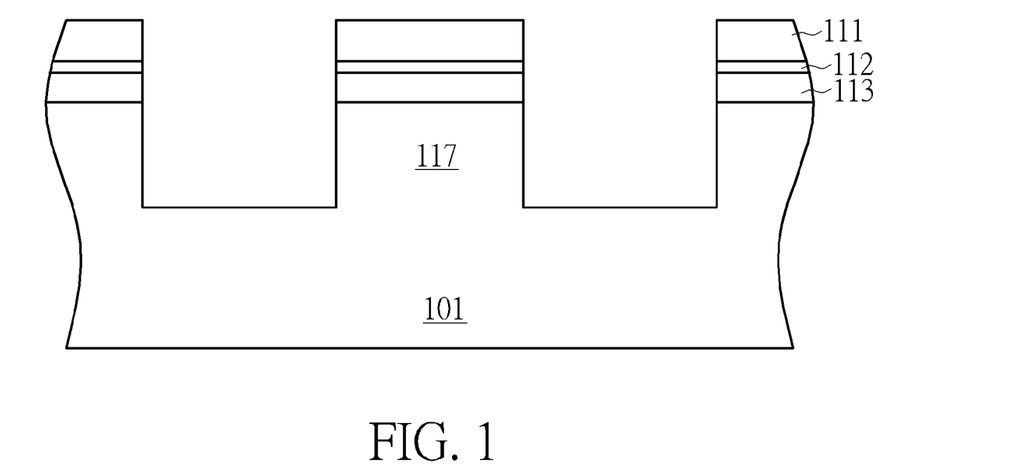

The fin structure 110 may be formed as follows. First, as shown in FIG. 1, a mask layer 111, a buffer layer 112 and a cap layer 113 are provided on the substrate 101. The cap layer 113 may include silicon oxynitride and blanket deposited on the substrate 101 by deposition. The buffer layer 112 including silicon oxide is formed on the cap layer 113 by deposition. A patterned mask layer 111 is formed on the buffer layer 112 so that the mask layer 111 has a pattern to define the fin structure 110. The mask layer 111 may be a hard mask, such as a hard mask including silicon nitride. The method for forming the patterned mask layer 111 may be the pattern on a pre-patterned photoresist (not shown) is transferred to the mask layer 111 by etching.

Second, as shown in FIG. 1, the patterned mask layer 111 is used as an etching mask to carry out a fin structure etching step. The fin structure etching step partially removes the buffer layer 112, the cap layer 113 and the substrate 101 to roughly define the profile of the fin structure 110. Some of the substrate 101 below the cap layer 113 becomes a fin conductive layer 117. A dry etching may be used to carry out the fin structure etching step. For example, the buffer layer 112 and the cap layer 113 are etched by $CF_4$, $O_2$ and He. Besides, the substrate 101 is etched by HBr, $O_2$ and He.

Figure 2:
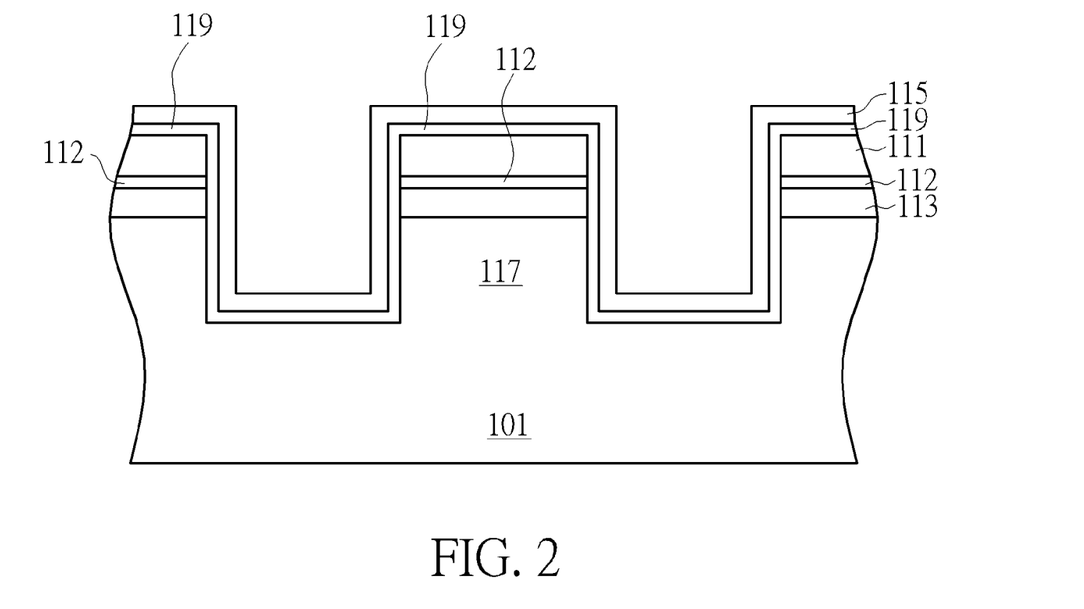

Then as shown in FIG. 2, a spacer material layer 115 is formed on the mask layer 111, the buffer layer 112, the cap layer 113 and the substrate 101 to cover the previously formed material layers and the fin conductive layer 117. The spacer material layer 115 may include silicon nitride. Optionally, before the spacer material layer 115 is deposited, another buffer layer 119 of silicon oxide may be formed in advance so that the buffer layer 119 becomes a second spacer material layer and the spacer material layer 115 becomes a first spacer material layer.

Figure 3:
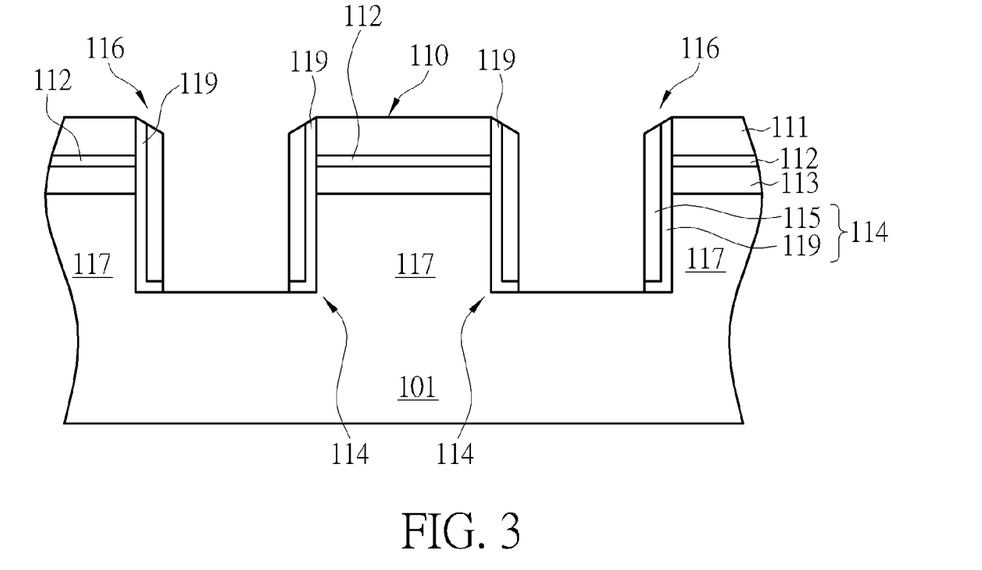

Then, as shown in FIG. 3, a side wall etching step is carried out to partially remove the spacer material layer 115 and the optional buffer layer 119. At last, a spacer 114 is obtained to protect the fin conductive layer 117 and the resultant fin structure 110. In other words, the spacer 114 may include the spacer material layer 115 and the optional buffer layer 119. In addition, the spacer 114 may surround the mask layer 111, the buffer layer 112, the cap layer 113 and the fin conductive layer 117. The side wall etching step may also remove some of the fin structure 110 to form a rounded corner 116.

Figure 4:
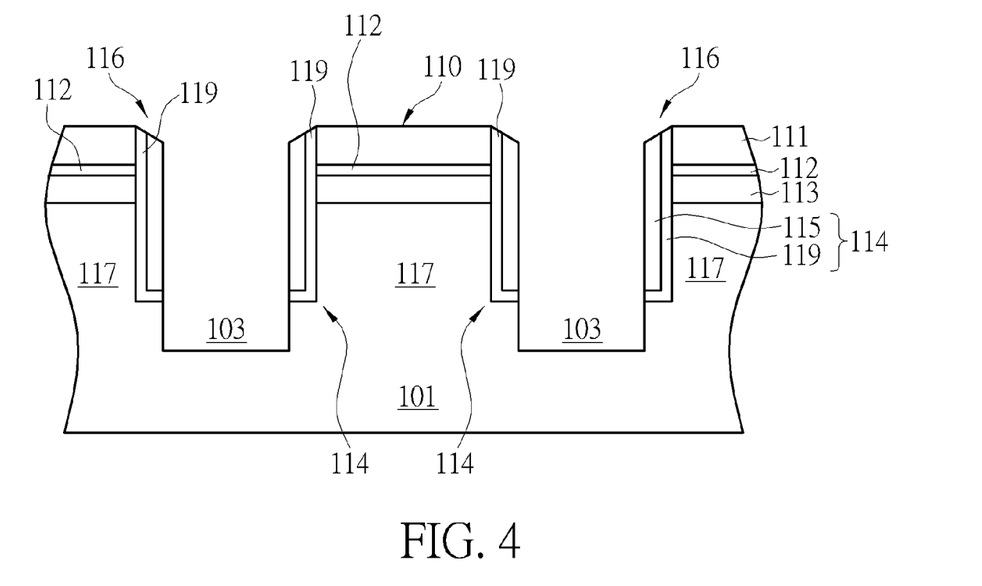
Figure 5:
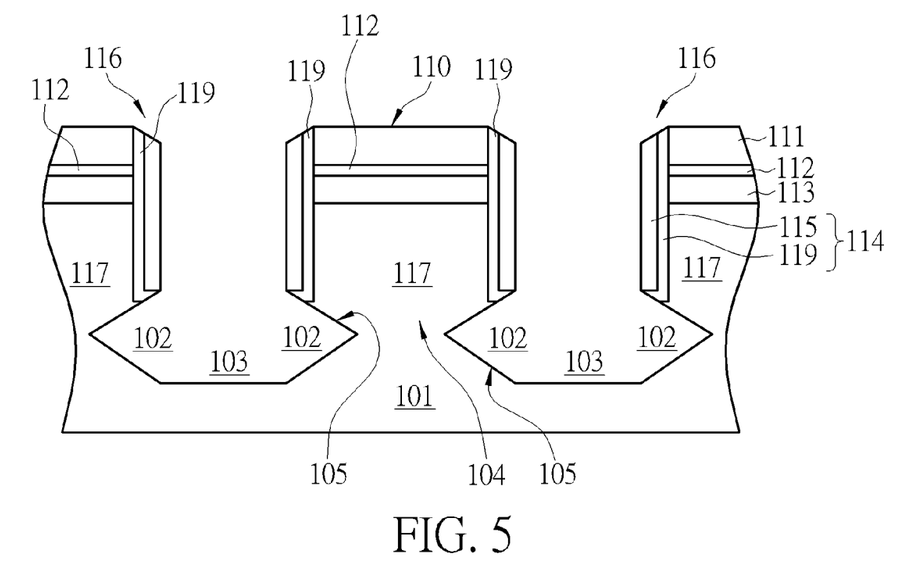

Continuing, as shown in FIGS. 4 and 5, the mask layer 111 and the spacer 114 are used as the etching masks to carry out a substrate etching step to form a first recess 103 and a second recess 102 connecting to the first recess 103 in the substrate 101. The positions of the first recess 103 and the second recess 102 are relative, for example, the second recess 102 surrounds the first recess 103. The substrate etching step to form the first recess 103 and the second recess 102 is not a single etching procedure, and usually includes multiple etching procedures, to respectively construct the needed first recess 103 and second recess 102.

For example, the substrate etching step may include at least one vertical etching step and at least one lateral etching step. Since the order of the vertical etching step and the lateral etching step of the present invention is not crucial, one of the vertical etching step and the lateral etching step is first carried out then the other one is carried out for example.

Figure 5A:
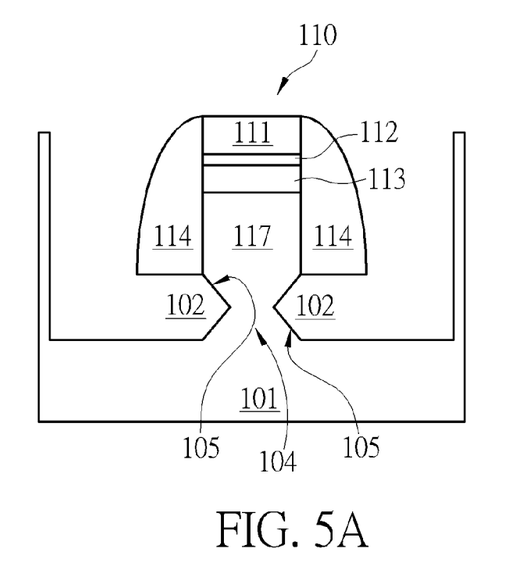
Figure 6A:
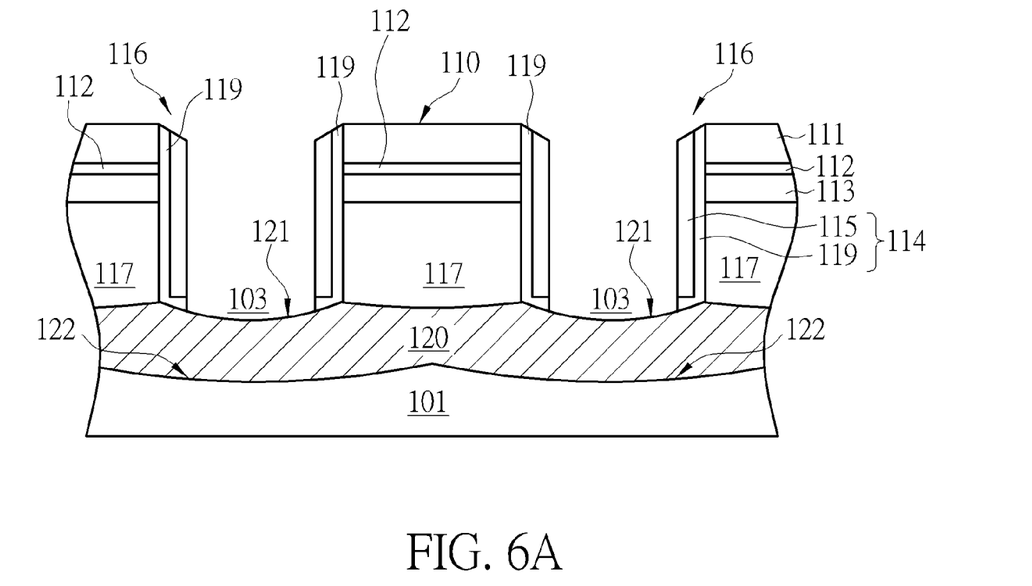
Figure 6B:
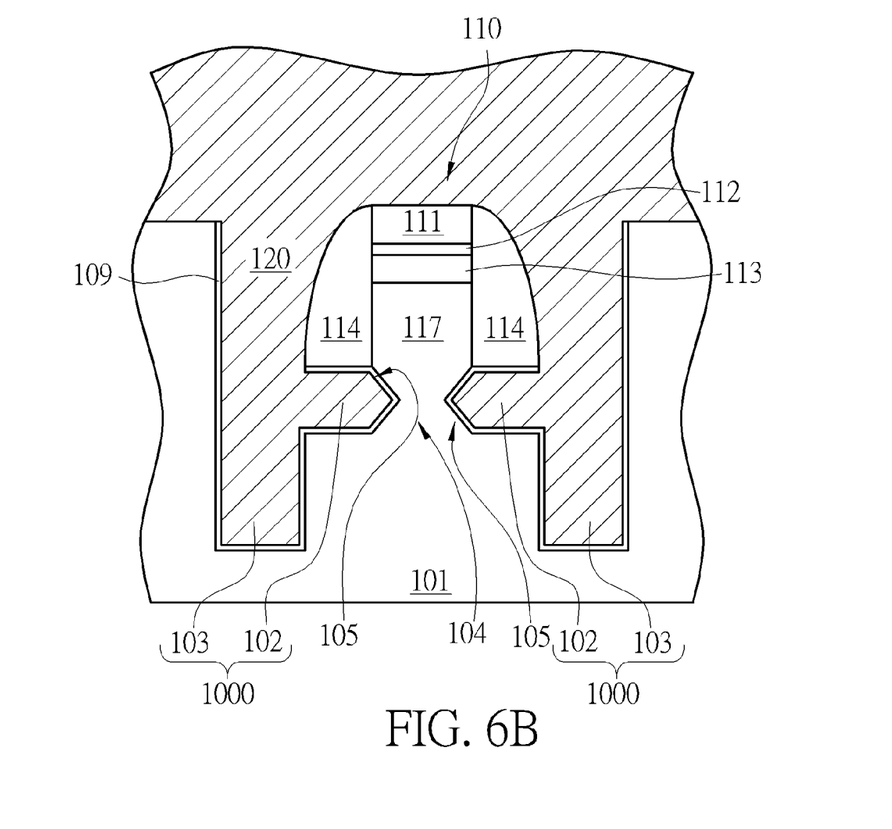

In one embodiment as shown in FIG. 4, the vertical etching step is first carried out to construct the first recess 103. For example, a dry etching such as $SF_6$ and He is used to remove some exposed substrate 101 to construct the first recess 103 of a needed size, for example, 5 nm~100 nm deeper from the spacer 114. Later, as shown in FIG. 5, a dry etching alone or in combination with a wet etching may be used to carry out the vertical etching step to form the needed second recess 102 and simultaneously to form a bottle neck 104 under the fin structure 110. For example, the dry etching may be $SF_6$ and He to remove the substrate 101 and the wet etching may be aqueous $NH_3$ and low concentration $H_2O_2$ to remove the substrate 101. Please note that the second recess 102 is preferably in a wedge shape, that is, a protruding side 105 extends to and under the fin structure 110 by etching along a certain Si lattice. Of course, as shown in FIG. 5A, a lateral etching step may be carried out first to form the second recess 102. Then, as shown in FIG. 6B, the first recess 103 can be form by a vertical etching step. The second recess 102 and the first recess 103 together to form a combined recess 1000. The combined recess 1000 may be in a shape of an inversed L. Optionally, the bottle neck 104 may have a width between 3 μm-10 μm, or the width of the bottle neck 104 may be 40%-60% of that of the fin structure 110.

Next, an oxide layer to fill the first recess 103 and the second recess 102 is about to be formed. There may be different approaches to form the oxide layer. Different approaches may make the resultant oxide layer structurally different so that the final FINFET transistor structures are accordingly different, too.

In a first embodiment of the present invention, an filling layer which fully supports the fin structure 110 is formed. The filling layer can by silicon oxide or silicon oxynitride. Please refer to FIG. 6A, after the needed first recess 103 and second recess 102 are done, an oxidization procedure may be used to form the filling layer 120 which fully supports the fin structure 110. For example, a furnace oxidation procedure is used to oxidize the exposed substrate 101, that is to oxidize the Si atoms in the substrate 101 near the fin structure 110, the first recess 103 and the second recess 102, to form a filling layer 120 including silicon oxide and serve as a field oxide to segregate the substrate 101 and the fin structure 110. The thickness of the filling layer 120 may be 10 nm~200 nm and the bottle neck 104 vanishes because of the destructive oxidation procedure.

Owing to the introduction of oxygen atoms, the filling layer 120 fills up the second recess 102 and occupies most of the first recess 103 so the first recess 103 barely remains. In addition, due to the direct oxidation of Si atoms, the filling layer 120 is supposed to have a not even top side 121 and a not even bottom side 122, so it is different from what is formed by deposition. The filling layer 120 is substantially stress free.

Figure 7A:
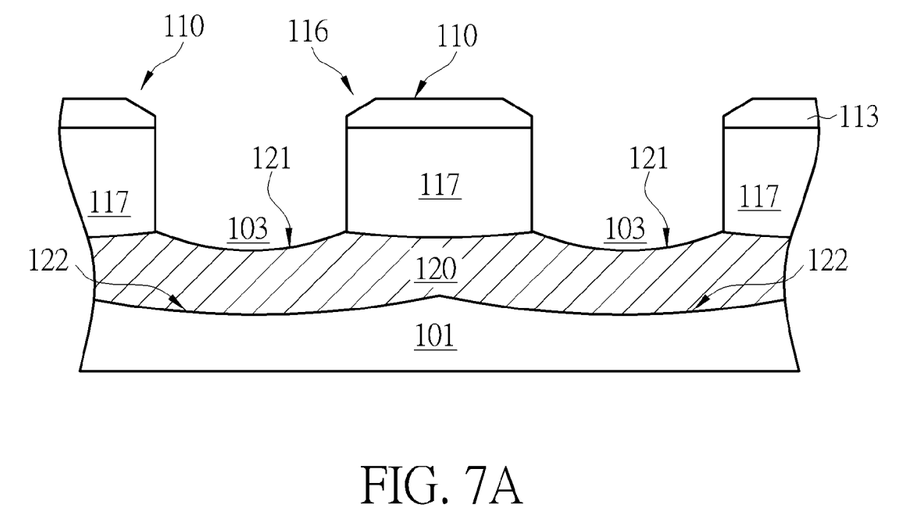

Because the spacer 114, the mask layer 111 and the buffer layer 112 are used to protect the fin structure 110 from being damaged by the etching or the oxidizing procedures, the spacer 114, the mask layer 111 and the buffer layer 112 are ready to be removed after the etching or the oxidizing procedures are done, as shown in FIG. 7A. For example, the spacer 114 may be removed by wet etching. If the spacer 114 includes the first spacer material layer and the second spacer material layer, removing the spacer 114 means simultaneously removing the first spacer material layer and the second spacer material layer.

In a second embodiment of the present invention, an oxide layer which fully covers the fin structure 110 is formed. Please refer to FIG. 6B, after the needed first recess 103 and second recess 102 are done, a deposition procedure may be used to form the filling layer 120 which fully covers the fin structure 110 and fully fills up the first recess 103 and second recess 102 without oxidizing the Si atoms in the substrate 101. Therefore, the filling layer 120 is monolithic.

For example, a spin-on dielectric (SOD) which coats a layer of liquid containing silicon oxide on the wafer surface and/or a deposition procedure is used to form the filling layer 120 which fully covers the fin structure 110, the first recess 103 and second recess 102 so that the filling layer 120 may include silicon oxide or silicon oxynitride. SOD fills the gap to exhibit good coverage. A thermo annealing is carried out on the liquid to transform it to a solid oxide layer. Please note that the fin structure 110 is still directly connected to the substrate 101 because no Si atoms are oxidized. Optionally, a pad layer 109 may be formed on the inner walls of the first recess 103 and second recess 102 in advance before the filling layer 120 is formed. The pad layer 109 may be formed by oxidizing the substrate 101. The pad layer 109 may be useful in smoothing the roughened surface of the substrate 101 and additionally repair the lattice structure to reduce the leak current.

Figure 7B:
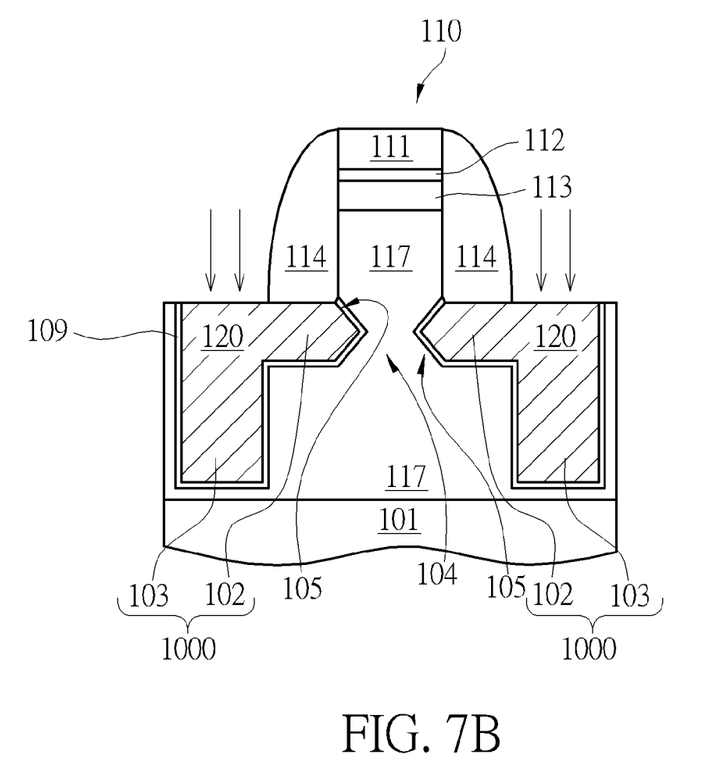

Later, please refer to FIG. 7B, a CMP and a pull back step may be used to reduce some of the filling layer 120 by process control, so that the outer surface of the filling layer 120 and the bottom of the spacer 114 directly but barely align with each other. The filling layer 120 just fills up the first recess 103 and second recess 102 but completely exposes the fin structure 110. The pull back etching may be carried out by a dry etching such as $CF_4+O_2$ and Ar, wet etching such as dilute HF. Because the filling layer 120 which fills up the first recess 103 is deep in the substrate 101, it may be deemed as the common shallow trench isolation.

Because the spacer 114, the mask layer 111 and the buffer layer 112 are used to protect the fin structure 110 from being damaged by the etching or oxidizing procedures, the spacer 114, the mask layer 111 and the buffer layer 112 are ready to be removed after the etching or oxidizing procedures are done, as shown in FIG. 7A. For example, the spacer 114 may be removed by wet etching. If the spacer 114 includes the first spacer material layer and the second spacer material layer, removing the spacer 114 means simultaneously removing the first spacer material layer and the second spacer material layer.

Figure 8A:
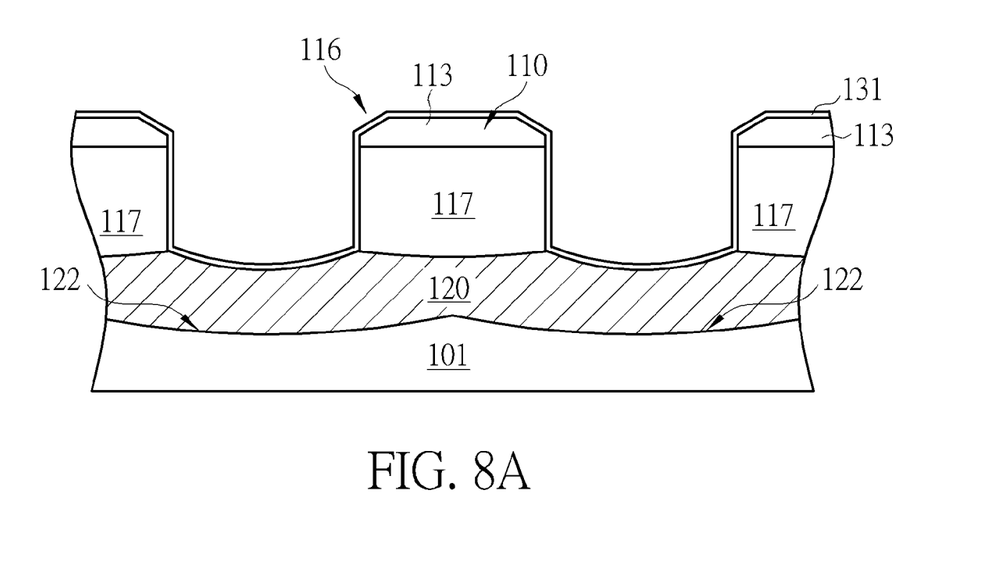
Figure 8B:
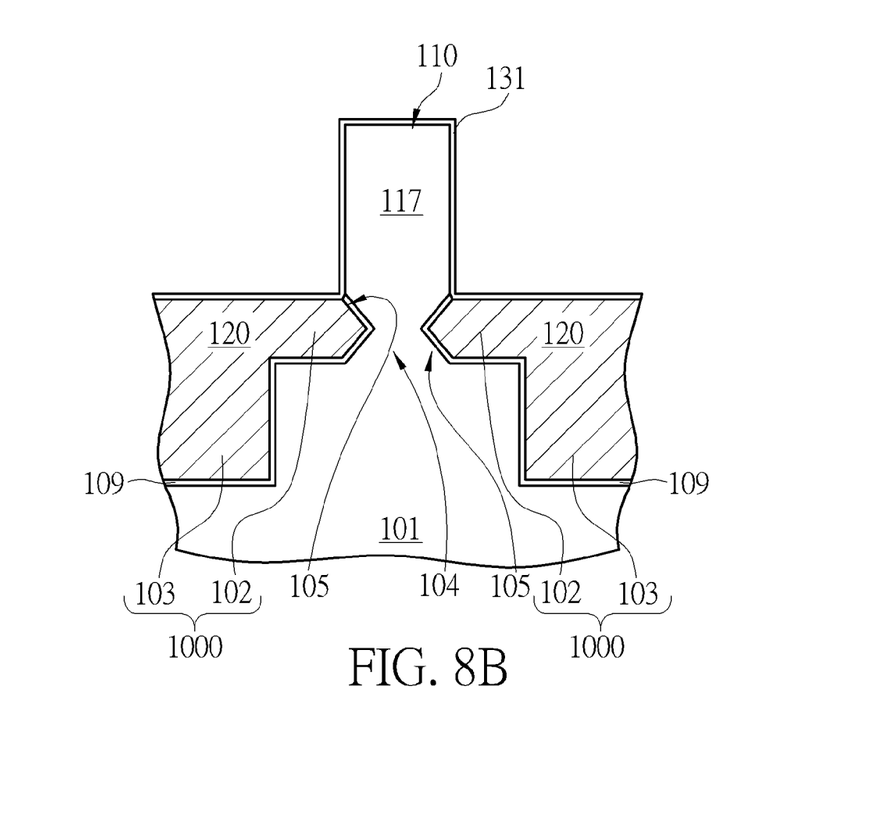

After the above formation of the oxide layer and different filling layer 120 are resultantly formed, the following steps for the formation of the gate are still universal. After the spacer 114 is removed, the needed gate dielectric layer 131 is formed. The former structure as illustrated in FIG. 7A now becomes the structure as illustrated in FIG. 8A. Or optionally, the cap layer 113 may be removed in advance, so the former structure as illustrated in FIG. 7B now becomes the structure as illustrated in FIG. 8B. The gate dielectric layer 131 may be a regular dielectric material, such as a silicon oxide of high quality, or a high-k material $HfO_2$ or $HfZrO_2$ or $ZrO_2$ or $BaTiO_3$ or $Al_2O_3$ or $Ta_2O_5$ or $La_2O_3$ or $Pr_2O_3$. The procedures for the gate dielectric layer 121 are well known to persons of ordinary skills in the art and the details will not be described here.

Figure 9A:
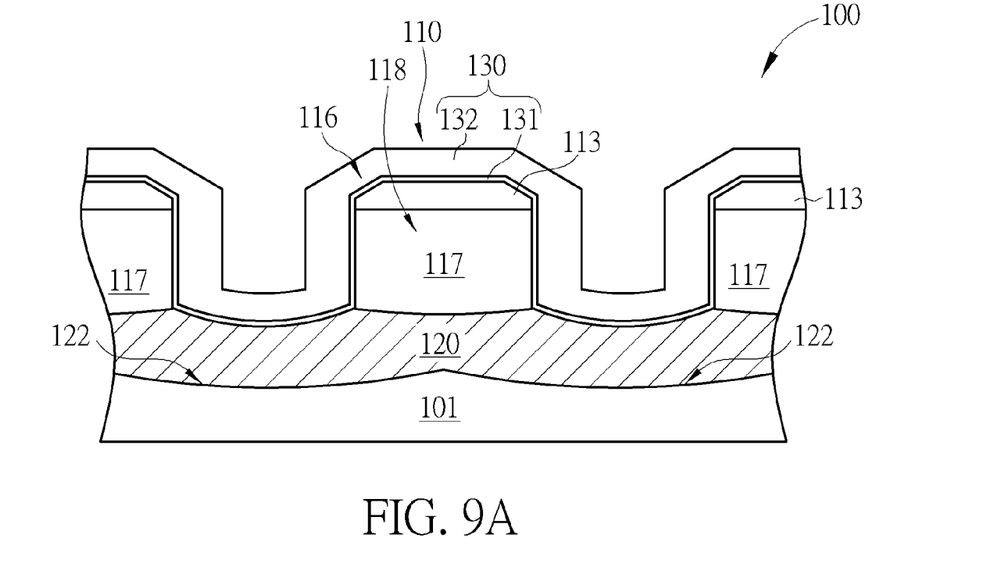
FIG. 9A illustrates a FINFET transistor structure of the present invention.
Figure 9B:
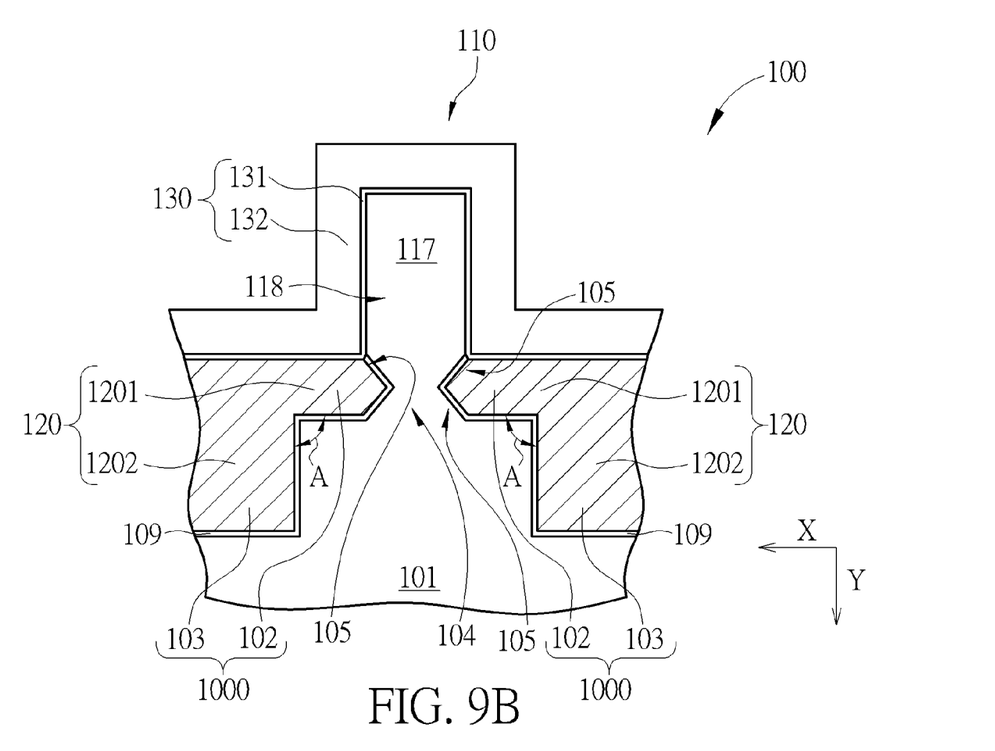
FIG. 9B illustrates another FINFET transistor structure of the present invention.

Later, a gate structure 130 disposed on the fin structure 110 and controlling the fin structure 110 is formed. For either the structure as illustrated in FIG. 8A or the structure as illustrated in FIG. 8B, a gate structure 130 can still be formed, so that the structure as illustrated in FIG. 8A becomes a FINFET transistor structure 100 as illustrated in FIG. 9A or the structure as illustrated in FIG. 8B becomes a FINFET transistor structure 100 as illustrated in FIG. 9B.

For example, a gate material layer 132 is completely deposited on the gate dielectric layer 131 and then an etching procedure is used to define the gate structure 130. If the cap layer 113 remains, the gate dielectric layer 131 is in direct contact with the cap layer 113. If the cap layer 113 is removed, the gate dielectric layer 131 directly surrounds the fin structure 110. At least, the patterned gate dielectric layer 131 and the gate material layer 132 together form the gate structure 130, and the methods for forming various FINFET transistor structures of the present invention are as described.

The methods for forming various FINFET transistor structures of the present invention may obtain at least two FINFET transistor structures. First, as shown in FIG. 9A, in a first embodiment of the present invention, a FINFET transistor structure 100 is provided. The FINFET transistor structure 100 of the present invention includes a substrate 101, a fin structure 110, a filling layer 120 and a gate structure 130. The substrate 101 is usually a semiconductive material, such as Si and can be oxidized to form silicon oxide in a suitable condition. The filling layer 120 is made by directly oxidizing the Si atoms in the substrate 101, so a filling layer 120 directly covers the substrate 101. As a result, the expensive SOI substrate is no longer needed in the FINFET transistor structure 100 of the present invention so it is advantageous in production cost.

The filling layer 120 itself has a top side 121 and a bottom side 122 in direct contact with the substrate 101. Because the filling layer 120 is made by directly oxidizing the Si atoms in the substrate 101, at least one of the top side 121 and the bottom side 122 is uneven. For example, the filling layer 120 includes a plurality of U-shape bottoms 122 so it is absolutely different from a flat surface (not shown) made by deposition procedure. Further, the filling layer 120 is substantially stress free.

The fin structure 110 is disposed on the filling layer 120 and includes a fin conductive layer 117 and a source/drain 118 disposed at two sides of the fin conductive layer 117. Preferably, the top of the fin structure 110 includes a rounded corner 116. In the FINFET transistor structure 100 of the present invention, there maybe more than one fin structure 110 so the fin structure 110 may be disposed between two adjacent U-shape bottoms 122. The fin conductive layer 117 in the fin structure 110 is originally part of the substrate 101 but it separates from the substrate 101 completely due to the segregation of the filling layer 120. Optionally, there maybe a cap layer 113, such as silicon oxynitride, covering the fin conductive layer 117 in the fin structure 110.

The gate structure 130 surrounds the fin structure 110 in three directions and includes a gate conductive layer 132 and a gate dielectric layer 131. The extending gate structure 130 is usually in a form of U-shape to control multiple fin structures 110 at the same time. The gate structure 130 controls the fin structure 110 in three directions if the cap layer 113 is removed. The gate structure 130 controls the fin structure 110 in two directions if the cap layer 113 remains.

As shown in FIG. 9B, in a second embodiment of the present invention, another FINFET transistor structure 100 is provided. The FINFET transistor structure 100 of the present invention includes a substrate 101, a fin structure 110, two combined recesses 1000, two filling layers 120 and a gate structure 130. The filling layers 120 may include silicon oxide or silicon oxynitride. The fin structure 110 includes a fin conductive layer 117 and a source/drain 118. The substrate 101 is usually a semiconductive material, such as Si. A gate structure 130 crosses the fin structure 110. The two combined recesses 1000 are embedded within the substrate 101. Each of the combined recesses 1000 includes a first recess 103 extends in a vertical direction Y and a second recess 102 extends in a lateral direction X. The second recess 102 includes a protruding side 105 extends in the lateral direction X to and under the fin structure 110. The protruding side 105 is in a wedge shape. The lateral direction X and The vertical direction Y are shown by arrows in FIG. 9B. Furthermore, the protruding sides 105 under the fin structure 110 shape the substrate 101 to form a bottle neck 104. In other words, the protruding side 105 partially surrounds the bottle neck 104. Two filling layers 120 fill in the combined recesses 1000. The filling layers 120 in each of the combined recesses 1000 respectively include a right angle A. Each of the filling layers 120 has a lateral edge 1201 extends in the lateral direction X and a vertical edge 1202 extends in the vertical direction Y. An end of the lateral edge 1201 filling in the protruding side 105 is also in a wedge shape. The lateral edge 1201 and the vertical edge 1202 define the right angle A. The filling layers 120 are formed by deposition procedure to be around the fin structure 110 and disposed in the combined recesses 1000 without entirely covering the substrate 101. The fin structure 110 is directly connected to the substrate 101 by the bottle neck 104, which dissipates heat and reduces leak current as well. Optionally, the bottle neck 104 may have a width between 3 μm-10 μm, or the width of the bottle neck 104 may be 40%-60% of that of the fin structure 110. Further, the FINFET transistor structure 100 in the second embodiment of the present invention includes a pad layer 109 disposed between the filling layer 120 and the substrate 101.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A FINFET transistor structure comprising:
   a substrate comprising a fin structure; and
   two combined recesses embedded within the substrate, wherein each of the combined recesses comprises a first recess extending in a vertical direction and a second recess extending in a lateral direction, the second recess has a protruding side extending to and under the fin structure;
   two filling layers filling in the combined recesses, wherein each of the filling layers is monolithic and has a lateral edge extending in the lateral direction and an end of the lateral edge is in a wedge shape; and
   a gate structure crossing the fin structure.

2. The FINFET transistor structure of claim 1, wherein the fin structure further comprises a fin conductive layer and a source/drain.

3. The FINFET transistor structure of claim 1, wherein the protruding sides under the fin structure shape the substrate to form a bottle neck.

4. The FINFET transistor structure of claim 1, wherein each of the filling layers includes a right angle.

5. The FINFET transistor structure of claim 1, wherein each of the filling layer has a vertical edge extending in the vertical direction.

6. The FINFET transistor structure of claim 1, wherein the protruding side extends in the lateral direction.

7. The FINFET transistor structure of claim 1, wherein the protruding side is in a wedge shape.

8. The FINFET transistor structure of claim 1, wherein a cross section of the wedge shape comprises a triangle.

* * * * *